US007598658B2

(12) United States Patent
Takeuchi et al.

(10) Patent No.: US 7,598,658 B2
(45) Date of Patent: Oct. 6, 2009

(54) ULTRASONIC PROBE

(75) Inventors: Takashi Takeuchi, Otawara (JP); Hiroyuki Shikata, Nasushiobara (JP); Minoru Aoki, Nasushiobara (JP); Shinichi Sato, Kasukabe (JP); Masaaki Sudo, Yokohama (JP)

(73) Assignees: Kabuhsiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 0 days.

(21) Appl. No.: 11/860,799

(22) Filed: Sep. 25, 2007

(65) Prior Publication Data

US 2008/0238262 A1 Oct. 2, 2008

(30) Foreign Application Priority Data

Sep. 26, 2006 (JP) ............................ 2006-261119

(51) Int. Cl.
*H01L 41/08* (2006.01)

(52) U.S. Cl. ....................... 310/334; 600/457; 600/459

(58) Field of Classification Search ................. 310/334; 600/457, 459

See application file for complete search history.

(56) References Cited

U.S. PATENT DOCUMENTS

| | | | | |
|---|---|---|---|---|
| 5,550,408 | A * | 8/1996 | Kunitomo et al. | 257/737 |
| 6,774,467 | B2 * | 8/2004 | Horiuchi et al. | 257/673 |
| 6,936,336 | B2 * | 8/2005 | Matsunaga et al. | 428/209 |
| 7,246,435 | B2 * | 7/2007 | Okamoto et al. | 29/852 |
| 7,348,712 | B2 * | 3/2008 | Ogawa et al. | 310/334 |
| 2005/0261590 | A1 * | 11/2005 | Ogawa et al. | 600/459 |
| 2009/0088643 | A1 * | 4/2009 | Aoki et al. | 600/459 |

FOREIGN PATENT DOCUMENTS

| | | |
|---|---|---|
| JP | 2003-9288 | 1/2003 |

OTHER PUBLICATIONS

U.S. Appl. No. 12/240,221, filed Sep. 29, 2008, Aoki et al.

* cited by examiner

*Primary Examiner*—Jaydi SanMartin
(74) *Attorney, Agent, or Firm*—Oblon, Spivak, McClelland, Maier & Neustadt, L.L.P.

(57) ABSTRACT

An ultrasonic probe includes piezoelectric elements each including grooves parallel to each other and arrayed in a direction substantially parallel to the grooves, and a mixed member which is to fill the grooves and obtained by mixing in a nonconductive resin member a nonconductive granular substance with a coefficient of thermal expansion of not more than substantially $10^{-5}$ $K^{-1}$.

9 Claims, 10 Drawing Sheets

| | Maximum principal tensile stress [Mpa] | | | Maximum principal compressive stress [Mpa] | | |
|---|---|---|---|---|---|---|
| | 40°C | 50°C | 60°C | 40°C | 50°C | 60°C |
| Thermal expansion coefficient factor 100% | 59.2 | 88.8 | 118.4 | 30.2 | 45.6 | 60.5 |
| Thermal expansion coefficient factor 70% | 40.9 | 61.4 | 81.9 | 21 | 31.5 | 42 |
| Thermal expansion coefficient factor 30% | 23.1 | 34.6 | 46.1 | 12.9 | 19.3 | 25.8 |
| Without grooves | 16.3 | 24.4 | 32.6 | 18.5 | 27.7 | 36.9 |

| | $Al_2O_3$ | $ZrO_2$ | $SiO_2$ | $Y_2O_3$ |
|---|---|---|---|---|
| Specific gravity [kg/m$^3$] | 3.9 | 6 | 2.05 | 5.03 |
| Coefficient of linear thermal expansion [1/k] | $8.1 \times 10^{-6}$ | $9 \times 10^{-6}$ | $0.5 \times 10^{-6}$ | $8.9 \times 10^{-6}$ |
| Necessary mixing ratio [wt%] | 33 | 34 | 30 | 34 |

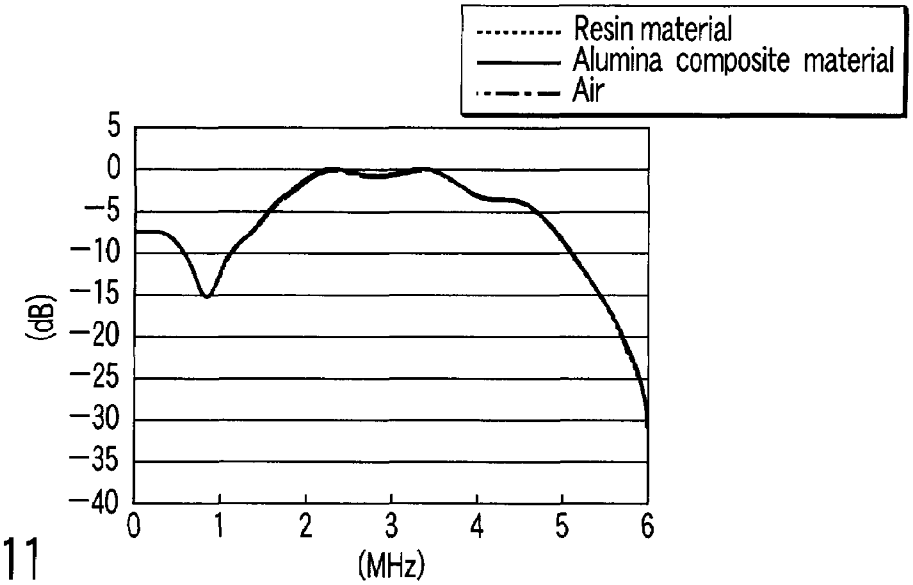
F I G. 11
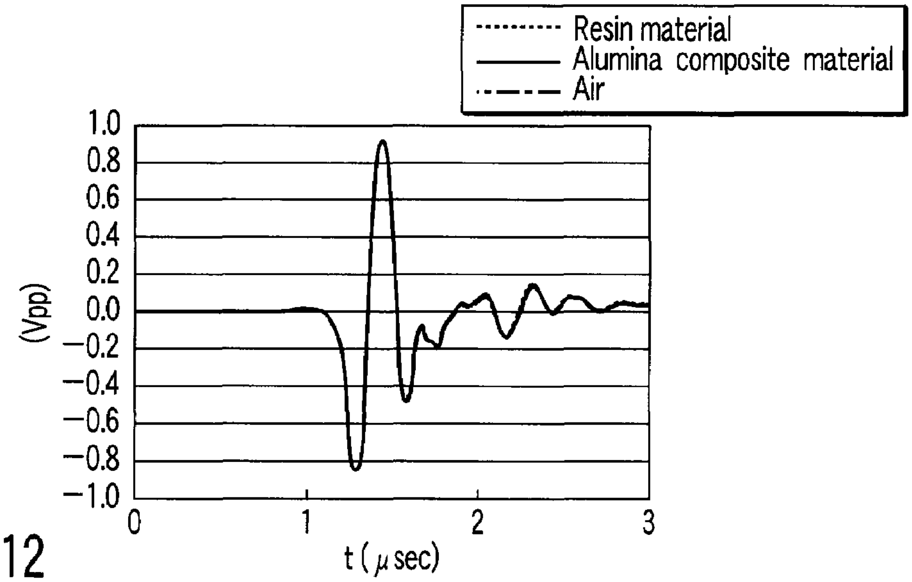
F I G. 12
| | $Al_2O_3$ | $ZrO_2$ | $SiO_2$ | $Y_2O_3$ |
|---|---|---|---|---|
| Specific gravity [kg/m$^3$] | 3.9 | 6 | 2.05 | 5.03 |
| Coefficient of linear thermal expansion [1/k] | $8.1 \times 10^{-6}$ | $9 \times 10^{-6}$ | $0.5 \times 10^{-6}$ | $8.9 \times 10^{-6}$ |
| Necessary mixing ratio [wt%] | 33 | 34 | 30 | 34 |
| Limit mixing ratio [wt%] | 60 | 34 | 191 | 42 |
F I G. 13

ULTRASONIC PROBE

CROSS-REFERENCE TO RELATED APPLICATIONS

This application is based upon and claims the benefit of priority from prior Japanese Patent Application No. 2006-261119, filed Sep. 26, 2006, the entire contents of which are incorporated herein by reference.

BACKGROUND OF THE INVENTION

1. Field of the Invention

The present invention relates to an ultrasonic probe.

2. Description of the Related Art

To reduce the side lobe of the sound field in a lens direction and achieve a uniform sound field, in an ultrasonic probe, a technique weights the transmission sound pressure intensity and the reception sensitivity. Examples of this technique include a method of forming grooves in a piezoelectric element which extend from the center to the end in the lens direction to gradually decrease the area of the piezoelectric element. In this case, these grooves may or may not divide the piezoelectric element completely. According to this method, only a resin material such as an epoxy resin fills the grooves of the piezoelectric element. This, however, leads to a composite structure in which the coefficient of thermal expansion of the grooves filled with the resin is different from that of the piezoelectric element. Hence, when the temperature changes in the piezoelectric element between the time when it is stored and the time when it generates heat, the degree of expansion differs between the grooves filled with the resin and the piezoelectric element. Then, a stress or strain occurs in the piezoelectric element, degrading the mechanical reliability. Due to the viscosity of the resin, the cutting load increases when cutting the piezoelectric element in an array direction, and the piezoelectric element easily breaks. Consequently, the yield of the piezoelectric element is reduced.

BRIEF SUMMARY OF THE INVENTION

It is an object of the present invention to provide an ultrasonic probe which can prevent destruction of the piezoelectric element during machining or use.

According to a certain aspect of the present invention, there is provided an ultrasonic probe comprising piezoelectric elements each including grooves parallel to each other and arrayed in a direction substantially parallel to the grooves, and a mixed member which is to fill the grooves and obtained by mixing in a nonconductive resin member a nonconductive granular substance with a coefficient of thermal expansion of not more than substantially $10^{-5}$ $K^{-1}$.

According to a certain aspect of the present invention, there is provided a piezoelectric transducer comprising a piezoelectric element including grooves, and a mixed member which is to fill the grooves and obtained by mixing in a nonconductive resin member a nonconductive granular substance with a coefficient of thermal expansion of not more than substantially $10^{-5}$ $K^{-1}$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 11 is a graph showing the relationship between the intensity [dB] and frequency [MHz] of the sound field of the ultrasonic beam generated by each ultrasonic probe according to the types of the fillers;

FIG. 12 is a graph showing the relationship between a signal voltage [Vpp] to be applied to each ultrasonic probe and time [μs] according to the types of the fillers; and FIG. 13 is a table showing the specific gravity [kg/m$^3$], coefficient [K$^{-1}$] of linear thermal expansion, necessary mixing ratio [wt %], and limit mixing ratio [wt %] of each of nonconductive fillers which are the same as those of FIG. 9.

DETAILED DESCRIPTION OF THE INVENTION

An embodiment of the present invention will be described with reference to the accompanying drawing.

Figure 1:
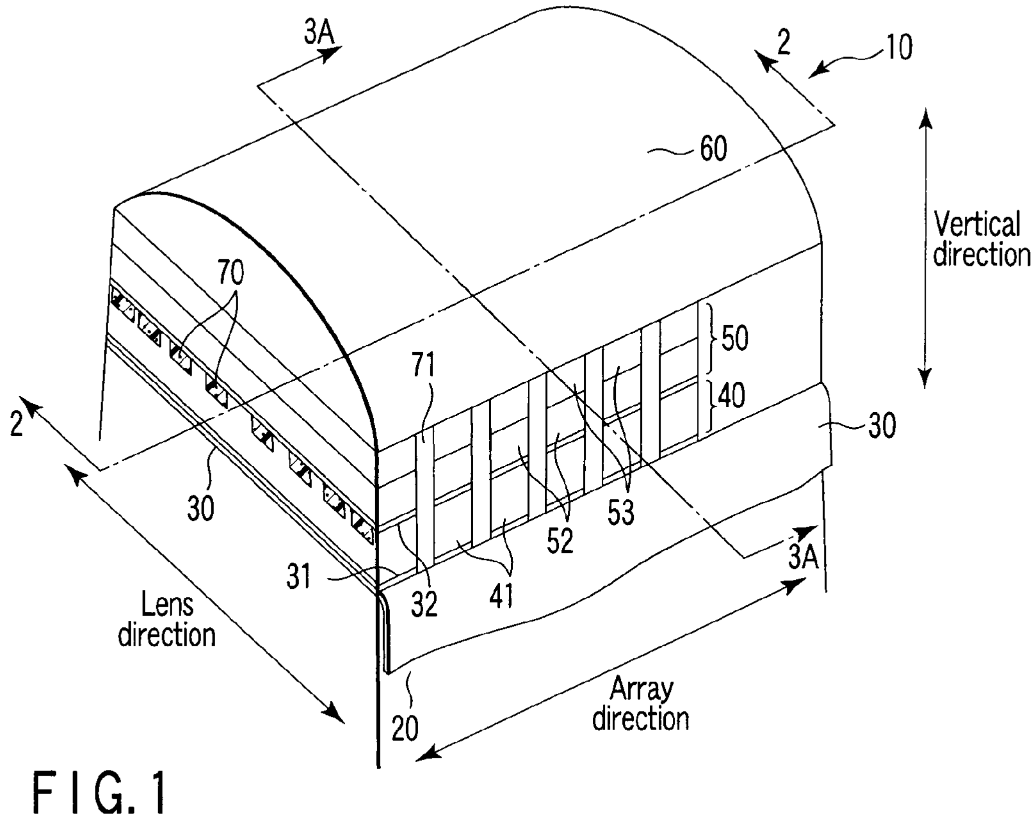
FIG. 1 is a perspective view showing the arrangement of an ultrasonic probe according to an embodiment.

FIG. 1 is a perspective view showing the arrangement of an ultrasonic probe 10 according to this embodiment. As shown in FIG. 1, the ultrasonic probe 10 has a sound absorbing backing material 20. The backing material 20 has a rectangular block-like shape. Piezoelectric transducers 40 are bonded to the upper portion of the backing material 20 through a flexible printed circuit board (FPC) 30.

Figure 2:
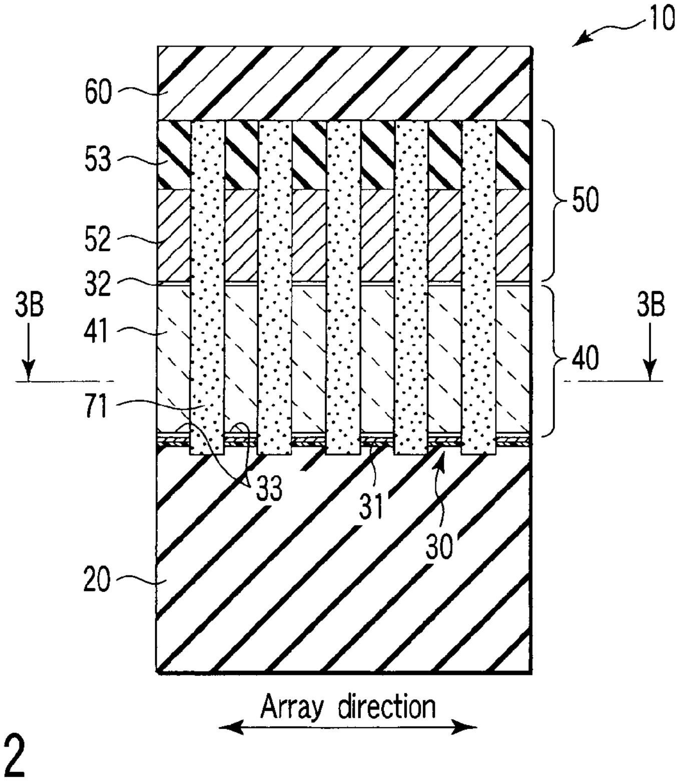
FIG. 2 is a view showing section 2-2 of the ultrasonic probe in FIG. 1.

FIG. 2 is a view showing section 2-2 of the ultrasonic probe in FIG. 1. As shown in FIG. 2, each piezoelectric transducers 40 comprises a piezoelectric element 41, a ground electrode 32 formed on the upper portion of the piezoelectric element 41, and a signal electrode 31 formed on the lower portion of the piezoelectric element 41. The piezoelectric elements 41 are strip-like. The piezoelectric elements 41 are arrayed so that gaps 71 are left between the elements. The piezoelectric elements 41 transmit and receive ultrasonic wave. The piezoelectric elements 41 are made of a piezoelectric ceramic material or a piezoelectric single crystal. The signal electrodes 31 and ground electrodes 32 are formed of metal foils such as copper foils. The signal electrodes 31 and ground electrodes 32 apply a driving voltage to the piezoelectric elements 41.

Figure 3A:
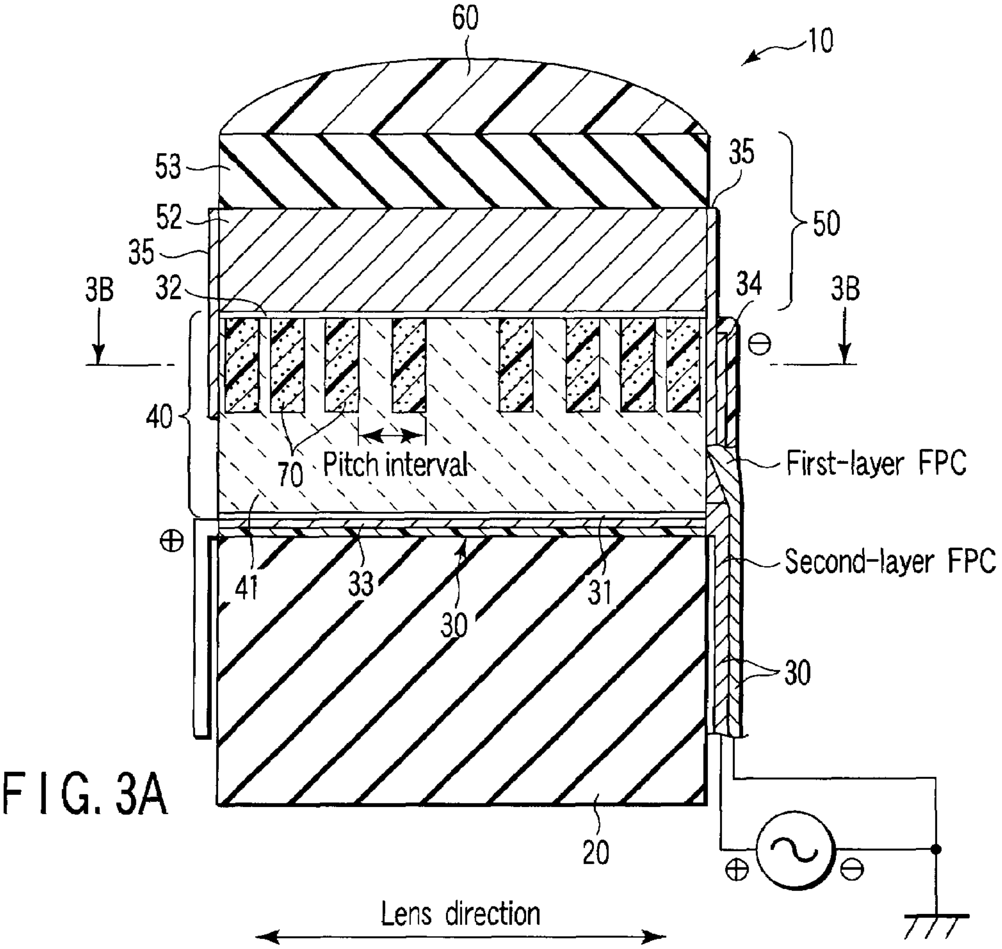
FIG. 3A is a view showing section 3A-3A of the ultrasonic probe in FIG. 1.
Figure 3B:
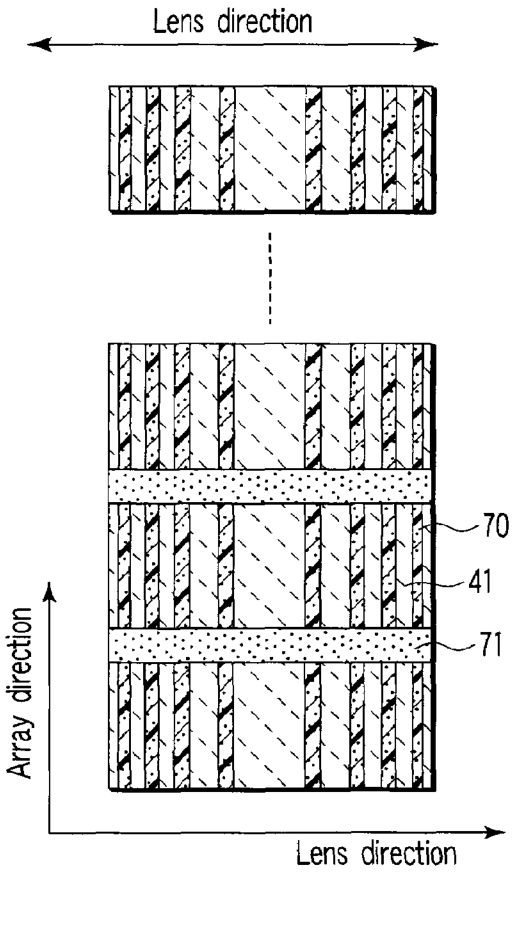
FIG. 3B is a view showing section 3B-3B of the ultrasonic probe in FIG. 2 and FIG. 3A.

FIG. 3A is a view showing section 3A-3A of the ultrasonic probe 10 in FIG. 1. FIG. 3B is a view showing section 3B-3B of the ultrasonic probe 10 in FIG. 2 and FIG. 3A. As shown in FIG. 3A and FIG. 3B, grooves which are arrayed along the lens direction are formed in the upper portions of the piezoelectric elements 41. A direction of each groove is parallel to the array direction. The grooves are equidistant, or their pitch is determined on the basis of a sine function. The pitch is the distance indicated by d in FIG. 3A. Although the pitch is determined on the basis of a sine function, the present invention is not limited to this. Another function such as a Gaussian function may be used to determine the pitch.

A composite material 70 is filled in the grooves which line up along the lens direction shown in FIG. 3A and FIG. 3B. The composite material 70 is obtained by mixing a nonconductive granular substance such as alumina powder (to be referred to as a nonconductive filler hereinafter) in a nonconductive resin material such as an epoxy resin. Mixing of the nonconductive filler in the resin material allows machining such as polishing, cutting, and dicing of the composite material 70 easier than the resin material. Namely, the composite material 70 can be cut better than the resin material. Considering the acoustic impedance, the proportions of the resin material and nonconductive filler in the composite material 70 are determined on the basis of the temperature when the piezoelectric elements 41 is used and at least one of the maximum principal stress value that the piezoelectric elements 41 can endure, the specific gravity of the composite material 70, and the coefficient of linear thermal expansion of the composite material 70. More specifically, desirably, the resin material occupies approximately 40% in weight ratio and the granular substance occupies approximately 60% in weight ratio. As the nonconductive filler, other than alumina powder, for example, silicon oxide powder, yttrium oxide powder, aluminum nitride powder, or the like is used. The coefficient of linear thermal expansion of the nonconductive filler is $10\times10^{-6}$ K$^{-1}$=$10^{-5}$ K$^{-1}$ or less. Note that K$^{-1}$ is the unit of coefficient of linear thermal expansion and indicates the reciprocal of the Celsius temperature. The relationship among the sound field intensity distribution of the ultrasonic beam of the composite material 70, the attenuation of the sound field, the signal voltage, and time is almost constant regardless of the type of the nonconductive filler. When considering the reflection of the ultrasonic beam, the grain sizes of these powders are preferably approximately one eighth the wavelength of the ultrasonic wave to be transmitted and received.

The signal electrodes 31 are respectively electrically connected to signal lines 33 of the flexible printed circuit board 30. With this arrangement, a driving signal is applied to the respective piezoelectric elements 41 independently of each other.

Acoustic matching layers 50 are formed on the upper portions of the piezoelectric transducers 40, respectively. More specifically, as shown in FIG. 2, one acoustic matching layer 50 and one piezoelectric element 41 form a pair. The acoustic matching layers 50 serve to suppress reflection of the ultrasonic wave generated by the difference in acoustic impedance between the target object and the piezoelectric elements 41.

Each acoustic matching layer 50 comprises a first acoustic matching layer 52 and a second acoustic matching layer 53. The large number of acoustic matching layers change the acoustic impedance stepwise from the piezoelectric elements 41 toward the target object.

The first acoustic matching layers 52 are made of a conductive material. The lower portions of the first acoustic matching layers 52 are electrically connected to the corresponding piezoelectric elements 41 through the ground electrodes 32. The upper portions of the first acoustic matching layers 52 are bonded to the corresponding second acoustic matching layers 53. The second acoustic matching layers 53 are made of an insulating material. An acoustic lens 60 is formed on the upper portions of the second acoustic matching layers 53.

The acoustic lens 60 is a lens made of silicone rubber or the like having an acoustic impedance close to that of the living organism. The acoustic lens 60 focuses the ultrasonic beam to improve the resolution in the lens direction.

A resin material (nonconductive adhesive) such as an epoxy resin fills the gaps 71 which are formed to line up in the array direction shown in FIG. 2.

As shown in FIG. 3A and FIG. 3B, the flexible printed circuit board 30 has a two-layer structure. The first-layer flexible printed circuit board (first-layer FPC) is provided with a ground line 34. The distal end of the first-layer flexible printed circuit board is integrally formed with the side of the lower end of a ground extension electrode 35. The ground line 34 is electrically connected to the ground extension electrode 35. The ground extension electrode 35 is formed on the side surface of the first acoustic matching layers 52 made of a conductive material, and electrically connected to them. The second-layer flexible printed circuit board (second-layer FPC) is provided with the signal lines 33 arranged at predetermined intervals in the array direction. The distal end of the second-layer flexible printed circuit board is arranged between the backing material 20 and piezoelectric elements 41, as described above. The signal electrodes 31 are electrically connected to the signal lines 33. A predetermined voltage is applied to the ground electrodes 32 and signal electrodes 31.

The second acoustic matching layers 53 are made of the nonconductive material. Alternatively, the second acoustic matching layers 53 may be made of a conductive material, and electrically connected to the ground extension electrode 35.

The manufacturing process of the ultrasonic probe 10 having the above arrangement will be described.

Figure 4A:
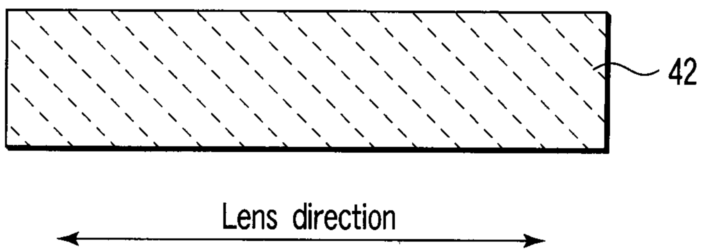
FIG. 4A is a view showing an initial step in the manufacturing process of the ultrasonic probe in FIG. 1.
Figure 4B:
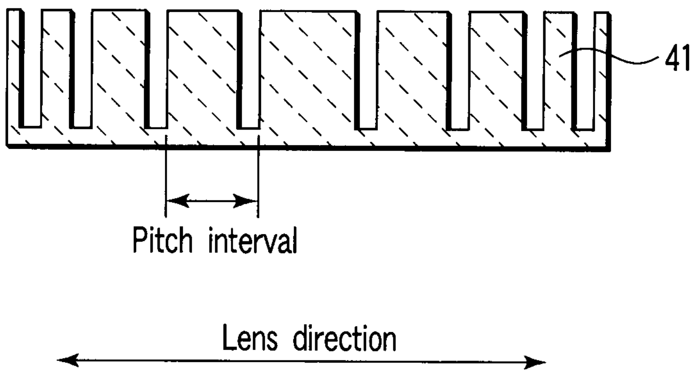
FIG. 4B is a view showing groove formation in the manufacturing process of the ultrasonic probe in FIG. 1.
Figure 4C:
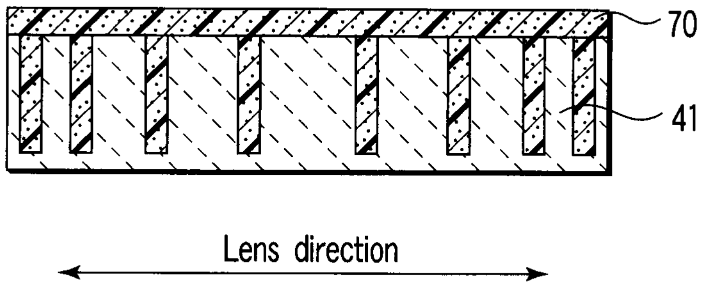
FIG. 4C is a view showing composite material filling in the manufacturing process of the ultrasonic probe in FIG. 1.
Figure 4D:
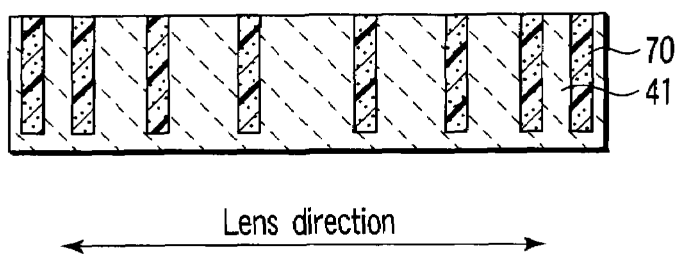
FIG. 4D is a view showing polishing in the manufacturing process of the ultrasonic probe in FIG. 1.
Figure 4E:
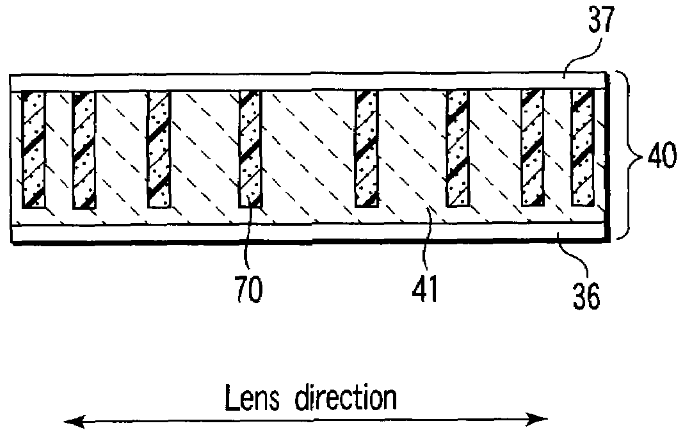
FIG. 4E is a view showing electrode formation in the manufacturing process of the ultrasonic probe in FIG. 1.

FIGS. 4A to 4K are views to explain the manufacturing process of the ultrasonic probe 10 according to this embodiment. First, as shown in FIG. 4A, a piezoelectric block (piezoelectric material) 43 is prepared. Then, as shown in FIG. 4B, grooves are formed parallel to each other in the piezoelectric block 43 along the array direction. This groove formation is to weight the ultrasonic beam described above. The grooves are formed with width and pitch based on a desired function. The grooves do not extend through the piezoelectric block 43 completely but terminate at a mid portion of the piezoelectric block 43. The piezoelectric block 43 formed with the grooves forms a piezoelectric element 41. Then, as shown in FIG. 4C, the composite material 70 is injected into the grooves of the piezoelectric element 41. As shown in FIG. 4D, the upper surface of the projection of the piezoelectric element 41 is exposed to obtain desired frequency characteristics. When exposing the upper surface, the composite material 70 is polished eventually. As the composite material 70 contains a nonconductive filler, its viscosity unique to the resin material is suppressed to facilitate polishing. Then, as shown in FIG. 4E, the piezoelectric element 41 undergoes plating or sputtering with gold or the like to form a first electrode 36 on the entire lower portion of the piezoelectric element 41 and a second electrode 37 on the entire upper portion of the piezoelectric element 41. After that, a predetermined voltage is applied to the first electrode 36 and second electrode 37. A piezoelectric transducer 40 is thus obtained.

Figure 4F:
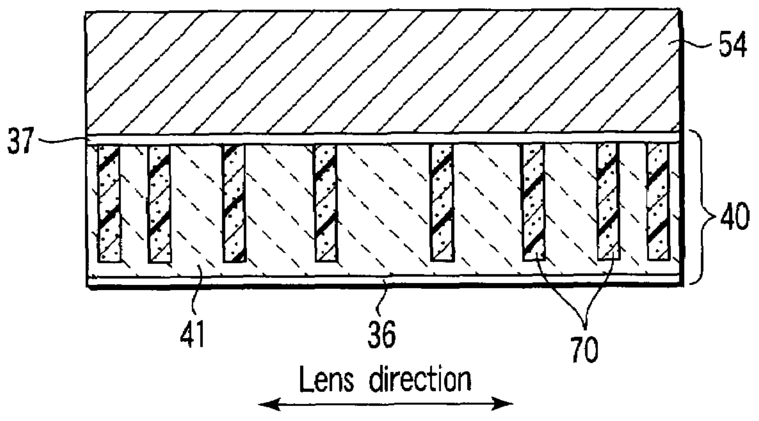
FIG. 4F is a view showing adhesion of the first acoustic matching layer in the manufacturing process of the ultrasonic probe in FIG. 1.
Figure 4G:
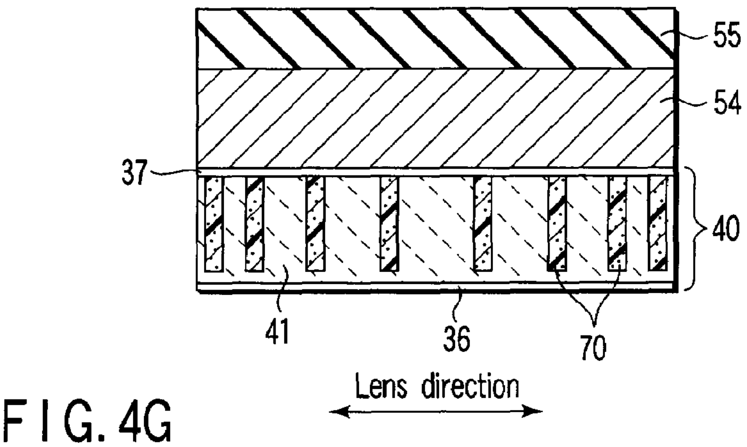
FIG. 4G is a view showing adhesion of the second acoustic matching layer in the manufacturing process of the ultrasonic probe in FIG. 1.
Figure 4H:
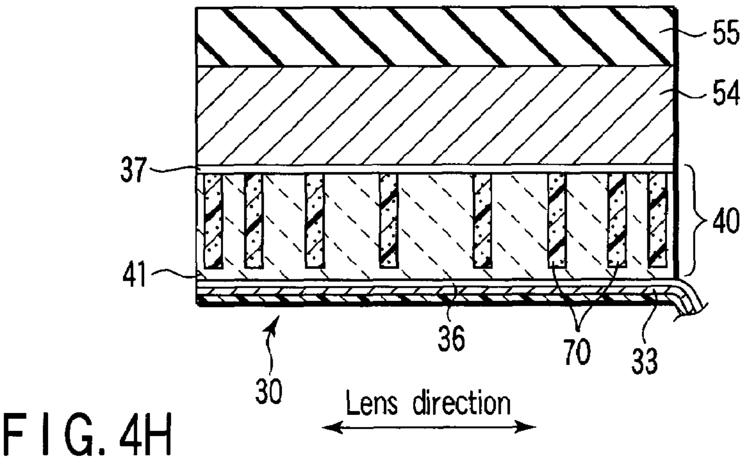
FIG. 4H is a view showing bonding of a flexible printed circuit board in the manufacturing process of the ultrasonic probe in FIG. 1.

When the piezoelectric transducer 40 is obtained in this manner, a first acoustic matching material 54 or the like is adhered to the upper portion of the piezoelectric transducer 40 with an epoxy adhesive or the like, as shown in FIG. 4F, to electrically bond the first acoustic matching material 54 to the second electrode 37. Then, as shown in FIG. 4G, a second acoustic matching material 55 is bonded to the upper portion of the first acoustic matching material 54. As shown in FIG. 4H, a flexible printed circuit board 30 is bonded to the first electrode 36 to electrically connect a signal line 33 to the first electrode 36.

Figure 4I:
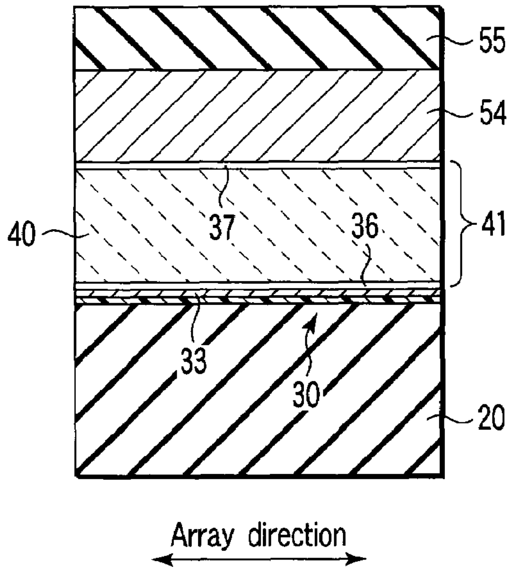
FIG. 4I is a view showing bonding of a backing material in the manufacturing process of the ultrasonic probe in FIG. 1.
Figure 4J:
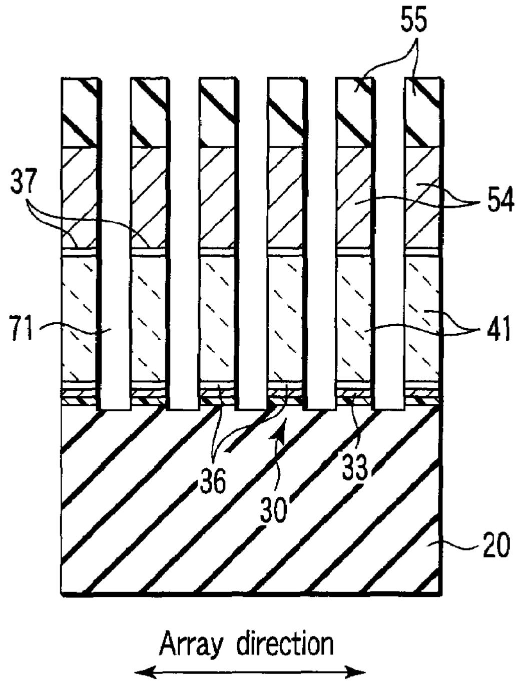
FIG. 4J is a view showing array formation in the manufacturing process of the ultrasonic probe in FIG. 1.

Subsequently, as shown in FIG. 4I, a backing material 20 is bonded to the lower portion of the flexible printed circuit board 30 bonded to the piezoelectric transducer 40. As shown in FIG. 4J, the piezoelectric transducer 40, first acoustic matching material 54, second acoustic matching material 55, first electrode 36, second electrode 37, and flexible printed circuit board 30 are diced from the second acoustic matching material 55 along the array direction. This dicing separates the piezoelectric transducer 40, first acoustic matching material 54, second acoustic matching material 55, first electrode 36, second electrode 37, and flexible printed circuit board 30 completely into piezoelectric elements 41, first acoustic matching layers 52, second acoustic matching layers 53, signal electrodes 31, and ground electrodes 32 completely at predetermined intervals along the array direction while forming gaps 71 among them. This dicing also segments the composite material 70 which fills the piezoelectric elements 41. As the composite material 70 can be cut well, the piezoelectric elements 41 will not break easily. A nonconductive resin material fills the gaps 71 which are formed at this stage among the respective piezoelectric transducers 40 and acoustic matching layers 50.

Figure 4K:
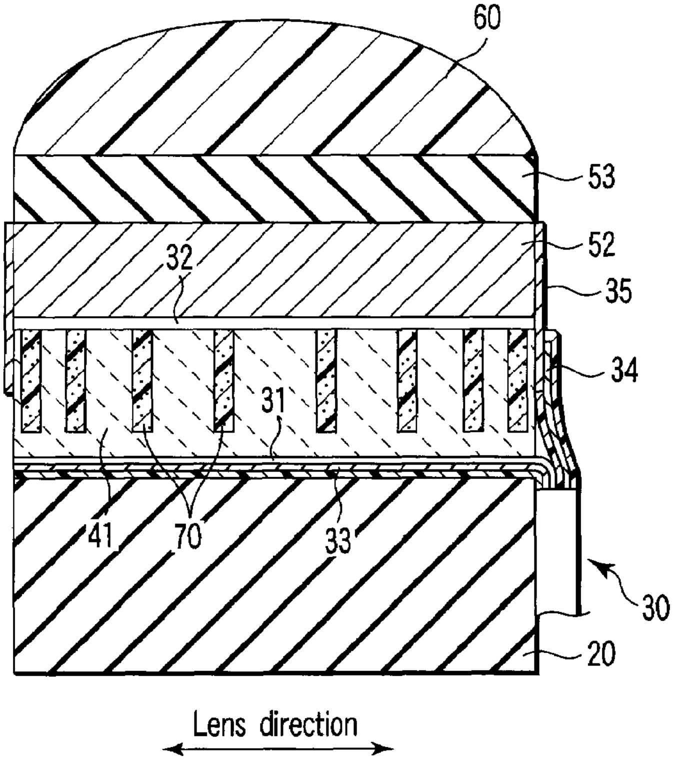
FIG. 4K is a view showing bonding of an acoustic lens in the manufacturing process of the ultrasonic probe in FIG. 1.

As shown in FIG. 4K, an acoustic lens 60 is bonded to the upper portion of the second acoustic matching layers 53, and a ground extension electrode 35 is bonded to the side portions of the first acoustic matching layers 52 with a conductive adhesive, to electrically connect the ground extension electrode 35 to a ground line 34 on the flexible printed circuit board 30. This completes the ultrasonic probe 10.

The manufacturing process of the ultrasonic probe 10 is not limited to that shown in FIGS. 4A to 4K. As an example, a manufacturing process of an ultrasonic probe which employs a method of forming electrodes on the upper and lower portions of a piezoelectric block 43 and thereafter forming grooves in the piezoelectric block 43 will be described with reference to FIGS. 5A and 5B.

Figure 5A:
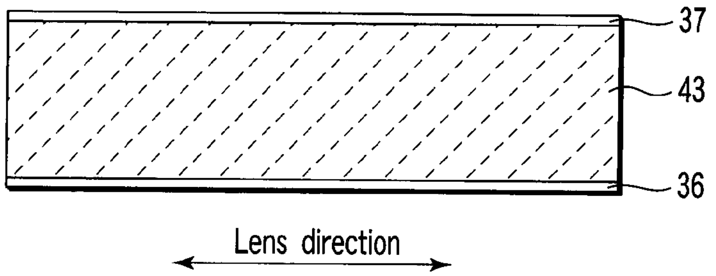
FIG. 5A is a view showing an initial step in the manufacturing process of an ultrasonic probe which is different from that of FIGS. 4A to 4K.
Figure 5B:
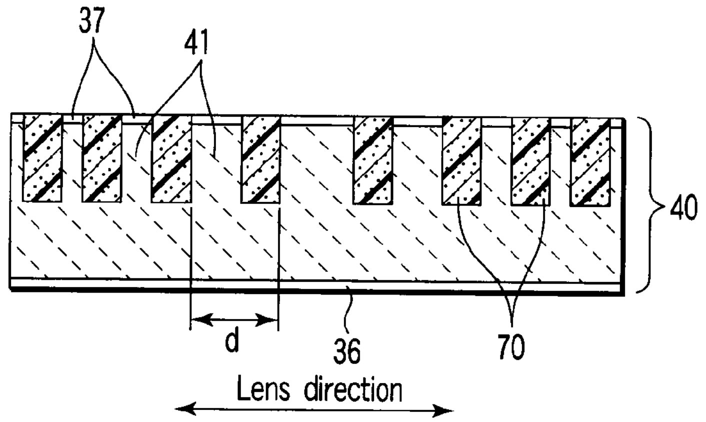
FIG. 5B is a view showing groove formation in the manufacturing method of the ultrasonic probe which is different from that of FIGS. 4A to 4K.

First, as shown in FIG. 5A, a predetermined voltage is applied to a first electrode 36 formed on the lower portion of the piezoelectric block 43 and a second electrode 37 formed on the upper portion of the piezoelectric block 43. Then, as shown in FIG. 5B, grooves are formed in the piezoelectric block 43 with width and pitch d based on a desired function from the second electrode 37 side along the array direction. This groove formation is performed to weight the ultrasonic beam, similarly as in FIG. 4B. This segments the second electrode 37 in the array direction to obtain a piezoelectric transducer 40.

After FIG. 5B, an ultrasonic probe 10 is manufactured with the same steps as those of FIGS. 4F to 4K. Accordingly, an explanation after this will be omitted. When performing dicing along the array direction in FIG. 4J, the composite material 70 which fills a piezoelectric element 41 is also segmented. As the composite material 70 can be cut well, its viscosity unique to the resin is suppressed to facilitate dicing.

Figure 6:
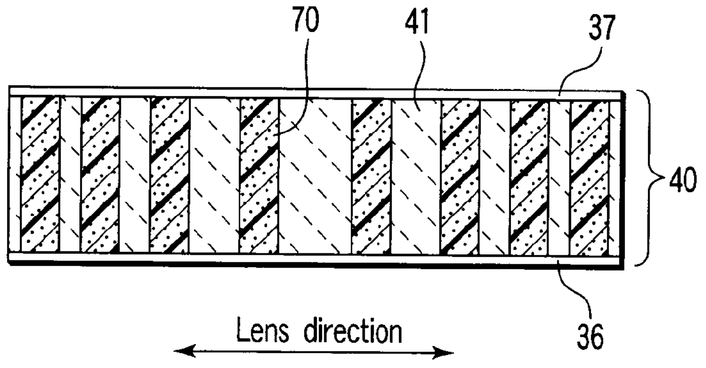
FIG. 6 is a view showing another shape of the piezoelectric transducer in FIGS. 4A to 4K.

FIG. 6 is a view showing another shape of the piezoelectric element 41. As in FIG. 6, grooves need not be formed, and the piezoelectric element 41 may be segmented into elements. In the step of FIG. 4J, not a resin material but the composite material 70 may fill the gaps 71.

The coefficient of thermal expansion of the composite material 70 is approximately one-third that of the resin material. Hence, the stress which is generated by the thermal expansion of the composite material 70 when the ultrasonic probe 10 is in use and acts on the piezoelectric element 41 becomes smaller than that generated by the thermal expansion of the resin material to act on the piezoelectric element 41. When the ultrasonic probe 10 is in use or undergoes machining, the piezoelectric transducers 40 generate heat. When the piezoelectric transducers 40 generate heat, the piezoelectric element 41 and composite material 70 are heated. As the degree of thermal expansion of the piezoelectric element 41 is close to that of the composite material 70, the thermal expansion of the composite material 70 does not cause stress on or distortion in the piezoelectric element 41.

Figures 7, 8:
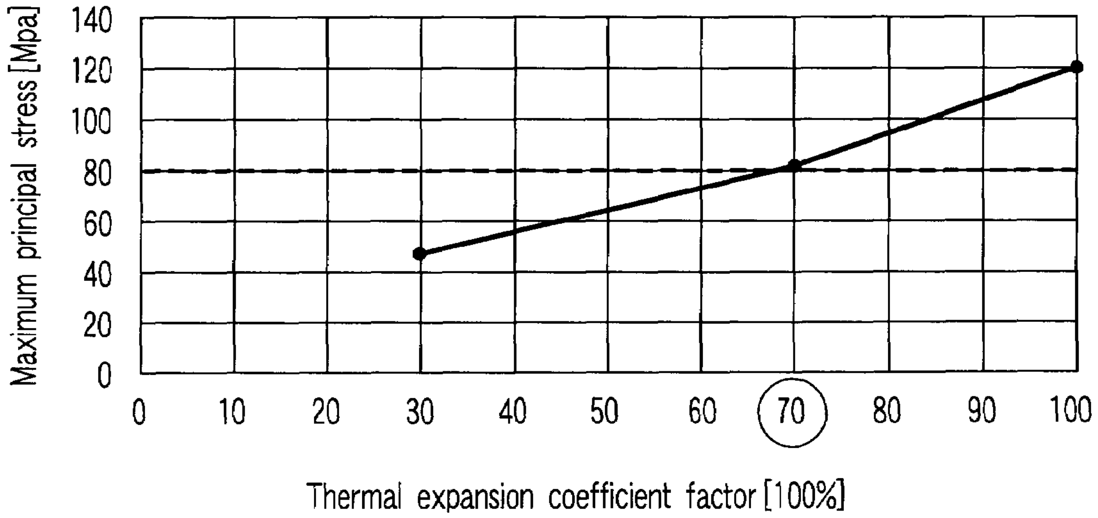
FIG. 7 is a table showing the temperature [° C.] of a piezoelectric element, the thermal expansion coefficient factor [%] of a composite material, and the maximum principal stress [MPa] of the piezoelectric element when the ultrasonic probe is in use.
FIG. 8 is a table showing the relationship between the maximum principal tensile stress value [MPa] and the thermal expansion coefficient factor [%] when the piezoelectric element is used at a temperature of 60° C.

FIG. 7 is a table showing the temperature [° C.] of the piezoelectric element 41, the coefficient of linear thermal expansion of the composite material 70 with reference to the coefficient of linear thermal expansion of the resin material as 100 (the coefficient of linear thermal expansion of the composite material 70 being hereinafter referred to as the thermal expansion coefficient factor [%]), and the maximum principal stress (the maximum principal tensile stress and the maximum principal compressive stress) [MPa] of the piezoelectric element 41 when the ultrasonic probe 10 is in use. The data shown in FIG. 7 are obtained by finite element method (FEM)

analysis. In the FEM analysis, the vertical thickness of the piezoelectric element 41 was set to 200 μm, and the vertical depth of the grooves formed in the piezoelectric element 41 was set to 100 μm. The upper limit of the maximum principal stress value that the piezoelectric element 41 according to this embodiment can endure without being broken is approximately 80 MPa. For the sake of safety, the temperature during use is required to be set to 60° C. or less. Hence, assume that the upper limit of the temperature during use is 60° C. As shown in FIG. 7, when the temperature is 60° C., the maximum principal tensile stress acting on a piezoelectric element 41 filled with a composite material 70 having a thermal expansion coefficient factor of 70% is 81.9 MPa. In this case, the piezoelectric element 41 breaks. Similarly, when the temperature is 60° C., the maximum principal tensile stress acting on a piezoelectric element 41 filled with a composite material having a thermal expansion coefficient factor of 30% is 46.1 MPa. In this case, the piezoelectric element 41 does not break. The data of FIG. 7 shows that the lower the thermal expansion coefficient factor, the smaller the maximum principal stress. Portions where the maximum principal stress exceeds 80 MPa are hatched. The data of FIG. 7 shows that the lower the temperature, the smaller the maximum principal stress. As the maximum principal tensile stress value is larger than the maximum principal compressive stress value, only the maximum principal tensile stress value will be considered hereinafter.

FIG. 8 is a table showing the relationship between the maximum principal tensile stress value [MPa] and the thermal expansion coefficient factor [%] when the temperature during use is 60° C. As shown in FIG. 8, during heating at 60° C., to prevent the piezoelectric element 41 from being broken, the thermal expansion coefficient factor should be approximately 70% or less.

Figures 9, 10:
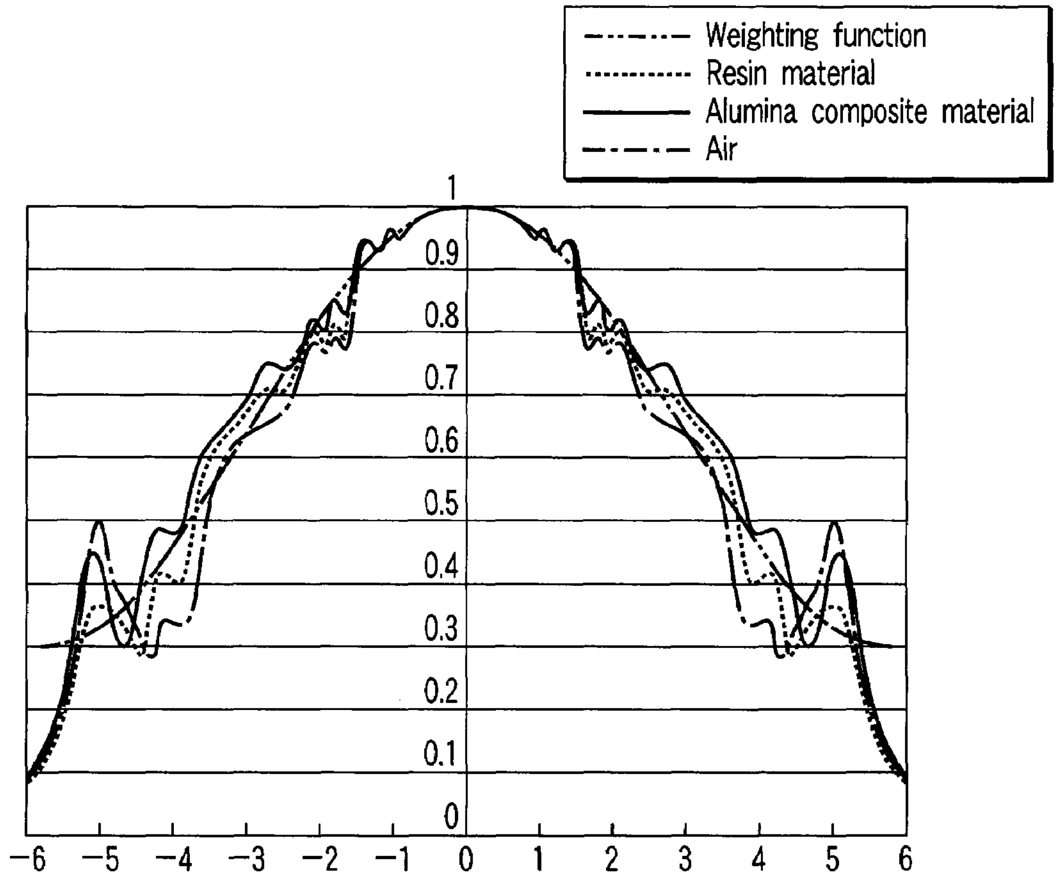
FIG. 9 is a table showing the specific gravity [$kg/m^3$], coefficient [$K^{-1}$] of linear thermal expansion, and necessary mixing ratio [wt %] of each of nonconductive fillers according to their types.
FIG. 10 is a graph showing the relationship between the intensity of the sound field, in a slice direction, of an ultrasonic beam generated by the ultrasonic probe and the type of the filler.

FIG. 9 is a table showing the specific gravity [kg/m$^3$], coefficient [K$^{-1}$] of linear thermal expansion, and necessary mixing ratio [wt %] of each of nonconductive fillers according to their types. As the nonconductive fillers, alumina ($Al_2O_3$), zirconia ($ZrO_2$), silicon oxide ($SiO_2$), and yttrium oxide ($Y_2O_3$) are employed. As shown in FIG. 9, each nonconductive filler has a coefficient of linear thermal expansion of $10\times10^{-6}$ K$^{-1}$ or less. The necessary mixing ratio [wt %] is the weight ratio [wt %] of the nonconductive filler to the composite material 70 that provides a thermal expansion coefficient factor of 70%. The necessary mixing ratio of each nonconductive filler is 30 wt % or more. Namely, from the relationship between FIGS. 8 and 9, if a composite material 70 containing 30 wt % or more in weight ratio of nonconductive filler fills the grooves, the thermal expansion of the composite material 70 during use will not break the piezoelectric element 41 irrespectively of the type of the nonconductive filler. If the weight ratio is 30 wt % or less, the piezoelectric element 41 may undesirably be broken during use. That is, the weight ratio of 30 wt % is the lower limit of the weight ratio of the nonconductive filler.

The higher the weight ratio, the farther away the intensity distribution of the sound field deviates from the ideal. The intensity distribution of the sound field changes depending on the granular size of the nonconductive filler and the specific gravity of the composite material, and does not change depending on the type of the nonconductive filler. The amount of nonconductive filler that can be mixed in the resin material has an upper limit value. The upper limit value of alumina is 60 wt % odd in weight ratio.

The characteristics of an ultrasonic beam generated by a composite material obtained by mixing in a resin material alumina with a weight ratio of 4:6 (referred to as an alumina composite material hereinafter) will be described. The data of the following FIGS. 10, 11 and 12 are obtained from the results of simulation. FIG. 10 is a graph showing the relationship between the intensity of the sound field, in the slice direction, of an ultrasonic beam generated by the ultrasonic probe and the type of the member to fill the grooves, in which the ordinate represents the intensity of the sound field, and the abscissa represents the distance in the slice direction. The peak positions of the sound pressures of the respective fillers are set at the same position.

The solid line, broken line, and single-dot dashed line in FIG. 10 represent the intensities of the sound fields of ultrasonic beams generated by ultrasonic probes 10 with grooves filled with an alumina composite material, a resin material, and air (the grooves are filled with nothing), respectively. The double-dot dashed line represents an ideal function (weighting function) of the sound field intensity. The intensity distribution of the sound field of the ultrasonic beam generated by the ultrasonic probe 10 filled with the alumina composite material is almost the same as that of the ultrasonic beam generated by the ultrasonic probe 10 filled with only the resin material, or that of the ultrasonic beam generated by the ultrasonic probe 10 filled with nothing.

FIG. 11 is a graph showing the relationship between the intensity [dB] and frequency [MHz] of the sound field of the ultrasonic beam generated by each ultrasonic probe 10 according to the types of the fillers.

FIG. 12 is a graph showing the relationship between a signal voltage [Vpp] to be applied to each ultrasonic probe 10 and time [μs] according to the types of the fillers. As shown in FIGS. 10, 11, and 12, the ultrasonic beam generated by the ultrasonic probe 10 filled with the alumina composite material has approximately the same characteristics as those of the ultrasonic beam generated by the ultrasonic probe 10 filled with only the resin material or those of the ultrasonic beam generated by the ultrasonic probe 10 not filled with anything. Thus, even when the composite material 70 is used, the characteristics of the ultrasonic beam of the ultrasonic probe 10 hardly change.

The specific gravity of the composite material 70 obtained by mixing in the resin material 60 wt % in weight ratio of alumina is 2.82 kg/m$^3$. The specific gravity of 2.82 kg/m$^3$ is almost one-third that of the piezoelectric element 41.

FIG. 13 is a table showing the specific gravity [kg/m$^3$], coefficient [K$^{-1}$] of linear thermal expansion, necessary mixing ratio [wt %], and limit mixing ratio [wt %] of each of nonconductive fillers which are the same as those of FIG. 9. The limit mixing ratio [wt %] is the weight ratio of the nonconductive filler when the specific gravity of the composite material 70 is 2.82 kg/m$^3$, in other words, is the upper limit value of the weight ratio of the nonconductive filler that can be mixed in the resin material. As shown in FIG. 13, in the case of, e.g., alumina, if the weight ratio is approximately 33 to 60 wt %, no problem occurs concerning the intensity distribution of the sound field, the fracture of the piezoelectric element 41 in use, and the like.

As described above, the weight ratio of the nonconductive filer of the composite material 70 is determined on the basis of the temperature of the piezoelectric element 41 in use, the principal stress value that the piezoelectric element 41 can endure, the specific gravity of the composite material 70, and the like. When the weight ratio is determined in this manner, prevention of fracture of the piezoelectric element 41 caused by the expansion of the composite material 70, which accompanies temperature rise, is realized while suppressing disorder of the ultrasonic sound field.

Therefore, this embodiment can prevent fracture of the piezoelectric element during machining or in use.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic probe, comprising:

piezoelectric elements each including grooves parallel to each other and arrayed in a direction of the grooves; and a mixed member which fills the grooves and is obtained by mixing, in a nonconductive resin member, a nonconductive granular substance with a coefficient of thermal expansion of not more than substantially $10^{-5}$ $K^{-1}$, wherein a lower limit of a weight ratio of the nonconductive granular substance to the mixed member is 30 wt %, and an upper limit thereof is determined by a largest amount of the nonconductive granular substance that can be mixed in the nonconductive resin member.

2. A probe according to claim 1, wherein a mixing ratio of the resin member and the granular substance is determined on the basis of a temperature of the piezoelectric elements and at least one of a stress value that the piezoelectric element is configured to endure, a specific gravity of the mixed member, and a coefficient of thermal expansion of the mixed member.

3. A probe according to claim 1, wherein the specific gravity of the mixed member is no more than approximately one-third a specific gravity of the piezoelectric elements.

4. A probe according to claim 1, wherein the coefficient of thermal expansion of the mixed member is determined on the basis of a temperature of the mixed member in use.

5. A probe according to claim 1, wherein the mixed member has such a coefficient of thermal expansion that the mixed member generates a stress that does not break the piezoelectric elements even when the mixed member thermally expands.

6. A probe according to claim 1, wherein a grain size of the granular substance is no more than substantially one-eighth a wavelength of an ultrasonic wave that the piezoelectric elements transmit and receive.

7. A probe according to claim 1, wherein the grooves are formed in each of the piezoelectric elements such that an intensity of an ultrasonic wave to be transmitted/received gradually decreases from a central portion toward an end of a direction in which the grooves are arrayed.

8. A piezoelectric transducers comprising:

a piezoelectric element including grooves; and a mixed member which fills the grooves and is obtained by mixing, in a nonconductive resin member, a nonconductive granular substance with a coefficient of thermal expansion of not more than substantially $10^{-5}$ $K^{-1}$, wherein a lower limit of a weight ratio of the nonconductive granular substance to the mixed member is 30 wt %, and an upper limit thereof is determined by a largest amount of the nonconductive granular substance that can be mixed in the nonconductive resin member.

9. An ultrasonic probe, comprising:

piezoelectric elements each including grooves parallel to each other and arrayed in a direction of the grooves; and a mixed member which fills the grooves and is obtained by mixing, in a nonconductive resin member, a nonconductive granular substance with a coefficient of thermal expansion of not more than substantially $10^{-5}$ $K^{-1}$, wherein a grain size of the granular substance is no more than substantially one-eighth a wavelength of an ultrasonic wave that the piezoelectric elements transmit and receive.

* * * * *

UNITED STATES PATENT AND TRADEMARK OFFICE

CERTIFICATE OF CORRECTION

PATENT NO. : 7,598,658 B2
APPLICATION NO. : 11/860799
DATED : October 6, 2009
INVENTOR(S) : Takeuchi et al.

It is certified that error appears in the above-identified patent and that said Letters Patent is hereby corrected as shown below:

On the title page, Item (73), the Assignees' information is incorrect. Item (73) should read:

-- (73) Assignee: Kabushiki Kaisha Toshiba, Tokyo (JP);
Toshiba Medical Systems Corporation,
Otawara-shi (JP) --

Signed and Sealed this

Seventeenth Day of November, 2009

David J. Kappos
*Director of the United States Patent and Trademark Office*